US005625210A

United States Patent [19]
Lee et al.

[11] Patent Number: 5,625,210
[45] Date of Patent: Apr. 29, 1997

[54] ACTIVE PIXEL SENSOR INTEGRATED WITH A PINNED PHOTODIODE

[75] Inventors: Paul P. Lee, Pittsford; Robert M. Guidash, Rush; Teh-Hsuang Lee, Webster; Eric G. Stevens, Rochester, all of N.Y.

[73] Assignee: Eastman Kodak Company, Rochester, N.Y.

[21] Appl. No.: 421,173

[22] Filed: Apr. 13, 1995

[51] Int. Cl.$^6$ .......................... H01L 31/062; H01L 31/113
[52] U.S. Cl. .......................... 257/292; 257/233; 257/369
[58] Field of Search .......................... 257/290, 291, 257/292, 232, 233, 369

[56] References Cited

U.S. PATENT DOCUMENTS

| | | | |
|---|---|---|---|
| 4,333,111 | 6/1982 | Noda et al. | 358/213 |
| 4,413,284 | 11/1983 | Izumita et al. | 358/213 |
| 4,484,210 | 11/1984 | Shiraki et al. | 357/24 |
| 4,809,075 | 2/1989 | Akimoto et al. | 358/213 |
| 4,908,518 | 3/1990 | Losee et al. | 358/213 |
| 4,984,047 | 1/1991 | Stevens | 357/30 |
| 5,051,797 | 9/1991 | Erhardt | 357/24 |
| 5,060,245 | 10/1991 | Nelson | 377/60 |
| 5,115,458 | 5/1992 | Burkey et al. | 377/58 |
| 5,182,623 | 1/1993 | Hynecek | 257/230 |
| 5,202,907 | 4/1993 | Yonemoto | 377/60 |
| 5,235,196 | 8/1993 | Anagnostopoulos et al. | 257/223 |
| 5,235,198 | 8/1993 | Stevens et al. | 257/232 |
| 5,256,891 | 10/1993 | Losee et al. | 257/233 |
| 5,306,931 | 4/1994 | Stevens | 257/223 |
| 5,337,340 | 8/1994 | Hynecek | 377/60 |
| 5,359,213 | 10/1994 | Lee et al. | 257/223 |
| 5,399,889 | 3/1995 | Miyaka et al. | 257/292 |
| 5,471,515 | 11/1995 | Fossum et al. | 377/60 |

FOREIGN PATENT DOCUMENTS

| | | | |
|---|---|---|---|
| 61-125081 | 6/1986 | Japan | H01L 29/76 |
| 62-160750 | 7/1987 | Japan | H01L 27/04 |
| 63-299268 | 12/1988 | Japan | H01L 27/14 |
| 1-135184 | 5/1989 | Japan | H04N 5/335 |
| 03-161964 | 7/1991 | Japan | H01L 27/06 |

OTHER PUBLICATIONS

"CMOS Active Pixel Image Sensor" by Mendis, et al, IEEE Transactions on Electron Devices, vol. 41, No. 3, March 1994, pp. 452–453.

"The Pinned Photodiode For An Interline-Transfer CCD Image Sensor" by Burkey, et al, IEDM84, 1984, pp. 28–31.

IEEE Transaction on Electron Devices, May 1991, vol. 38, No. 5, "The Operation Mechanism of a Charge Modulation Device (CMD) Image Sensor," K. Matsumoto, et al., pp. 989–990.

IEEE Transactions on Electron Devices, May 1991, vol. 38, No. 5, "Analysis of Operational Speed and Scaling Down the Pixel Size of a Charge Modulation Device (CMD) Image Sensor," by K. Matsumoto, et al., pp. 999–1004.

IEEE Transactions on Electron Devices, May 1991, vol. 38, No. 5, "A Small Pixel CMD Image Sensor," by M. Ogata, et al., pp. 1005–1010.

IEEE Transactions on Electron Devices, May 1991, vol. 38, No. 5, "BCMD-An Improved Photosite Structure for High-Density Image Sensors," by J. Hynecek, pp. 1011–1020.

IEEE Transactions on Electron Devices, May 1991, vol. 38, No. 5, "A 250 k-Pixel SIT Image Sensor Operating in its High-Sensitivity Mode," by T. Mizoguchi, et al., pp. 1021–1027.

(List continued on next page.)

*Primary Examiner*—Ngân V. Ngô
*Attorney, Agent, or Firm*—James D. Leimbach

[57] ABSTRACT

The optimization of two technologies (CMOS and CCD) wherein a pinned photodiode is integrated into the image sensing element of an active pixel sensor. Pinned photodiodes are fabricated with CCD process steps into the active pixel architecture. Charge integrated within the active pixel pinned photodiode is transferred into the charge sensing node by a transfer gate. The floating diffusion is coupled CMOS circuitry that can provide the addressing capabilities of individual pixels. Alternatively, a buried channel photocapacitor can be used in place of the pinned photodiode.

15 Claims, 4 Drawing Sheets

OTHER PUBLICATIONS

IEEE Transactions on Electron Devices, May 1991, vol. 38, No. 5, "Design of Bipolar Imaging Device (BASIS)," by Y. Nakamura, et al., pp. 1028–1036.

IEEE Transactions on Electron Devices, May 1991, vol. 38, No. 5, "Reduction of Fixed-Pattern Noise of BASIS Due to Low Kinetic Energy Reactive Ion and Native–Oxide–Free Processing," by M. Miyawaki, et al., pp. 1037–1043.

IEEE Transactions on Electron Devices, May 1991, vol. 38, No. 5, "A High–Sensitivity MOS Photo–Transistor for Area Image Sensor," by Y. Matsunaga, et al., pp.. 1044–1047.

"Amplified MOS Intelligent Images" by Andoh, et al., J.I.T.E. of Japan, vol. 41, Nov. 1987.

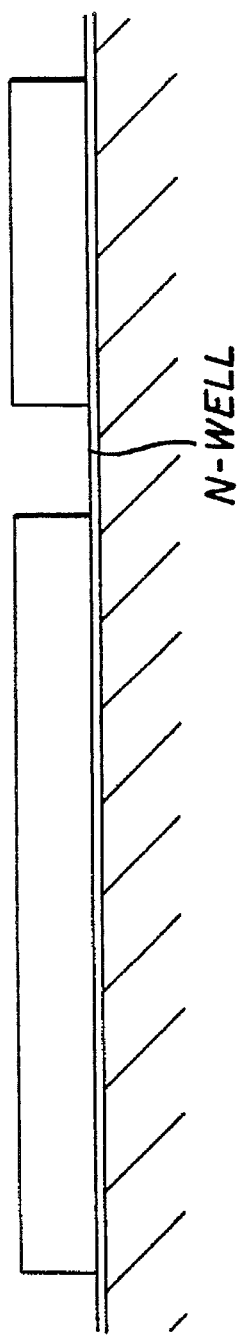
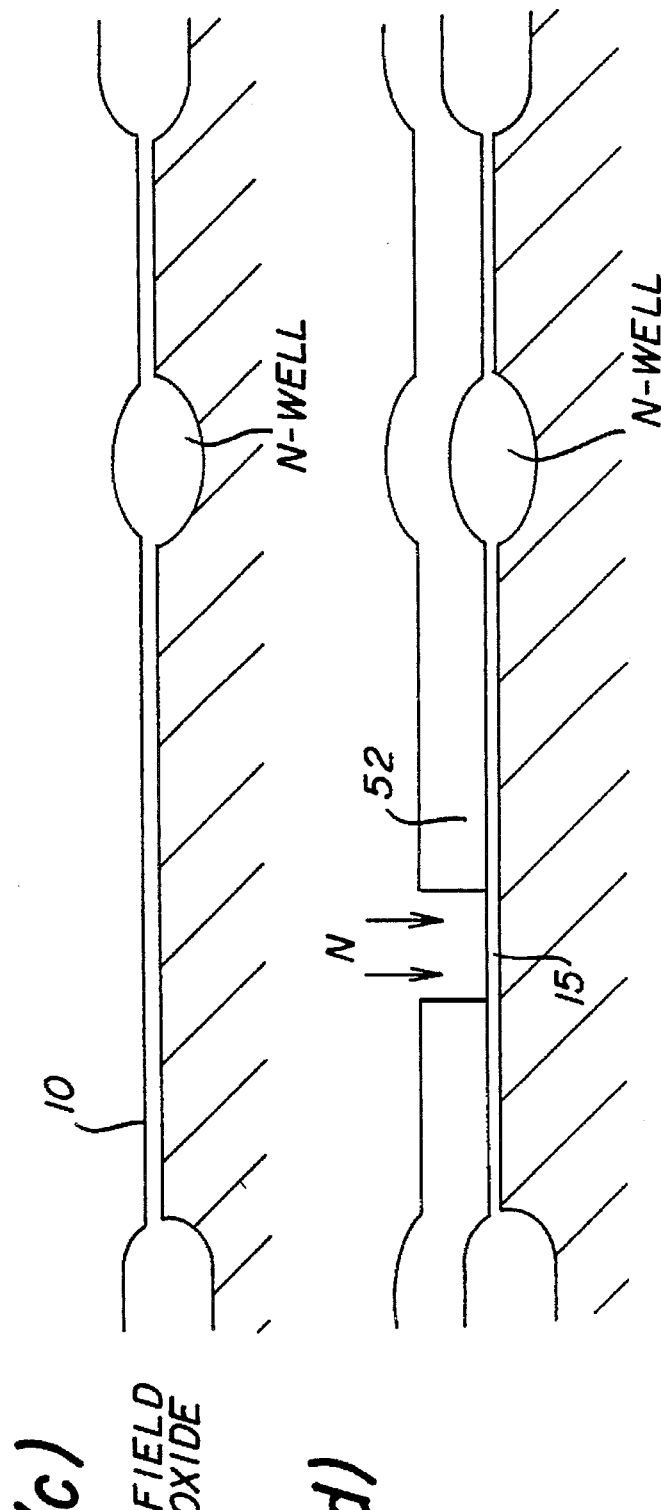
FIG.3(b)
FIG.3(c)
FIG.3(d)

ACTIVE PIXEL SENSOR INTEGRATED WITH A PINNED PHOTODIODE

FIELD OF THE INVENTION

The present invention relates to image sensing devices, and more particularly, to the integration of pinned photodiode technology within CMOS technology.

BACKGROUND OF THE INVENTION

Active pixel sensors refer to electronic image sensors within active devices, such as transistors, that are associated with each pixel. An active pixel sensor has the advantage of being able to easily incorporate signal processing and decision making circuitry on the same chip. Conventional active pixel sensors typically employ polysilicon photocapacitors or photodiodes as the active image sensing elements. These conventional active pixel sensors suffer from poor blue color response, high dark current and image lag.

Pinned photodiodes have been employed within charge coupled devices and have shown advantages in the area of color response for blue light, dark current density and image lag. For this reason pinned photodiodes are normally associated with high performance image sensors. Heretofore, pinned photodiodes have typically been employed as photoelements for charge coupled devices. An example of such a use of a pinned photodiode can be seen in THE PINNED PHOTODIODE FOR AN INTERLINE-TRANSFER CCD IMAGE SENSOR, by Burkey et al., IEDM 84, 1984, pages 28–31. However, charge coupled device technology lacks in the amount and type of circuitry elements that can be placed on a device.

From the foregoing discussion it should be apparent that there remains a need within the art of semiconductors for a pinned photodiode employed within a semiconductor technology that can provide advanced circuitry elements.

SUMMARY OF THE INVENTION

The present invention overcomes the shortcomings of the prior art by providing for the optimization of two technologies (CMOS and CCD) wherein a pinned photodiode is integrated into the image sensing element of an active pixel sensor. Pinned photodiodes are normally fabricated with CCD technology. By incorporating the appropriate process steps, a pinned photodiode can be integrated into the active pixel architecture. To improve the blue response and the dark current limitations of the active pixel sensor, a new CMOS imager has been integrated with a pinned photodiode using a mixed process technology. This technology combines CMOS and CCD processes to provide the best features from both technologies.

BRIEF DESCRIPTION OF THE DRAWINGS

FIG. 3a through FIG. 3g illustrate the various process steps employed in creating the device of FIG. 2.

DESCRIPTION OF THE PREFERRED EMBODIMENT

It has been discovered that technological features of a charge coupled device (CCD) can be employed to CMOS type semiconductors to create an active pixel sensor having a pinned photodiode.

Figure 1:
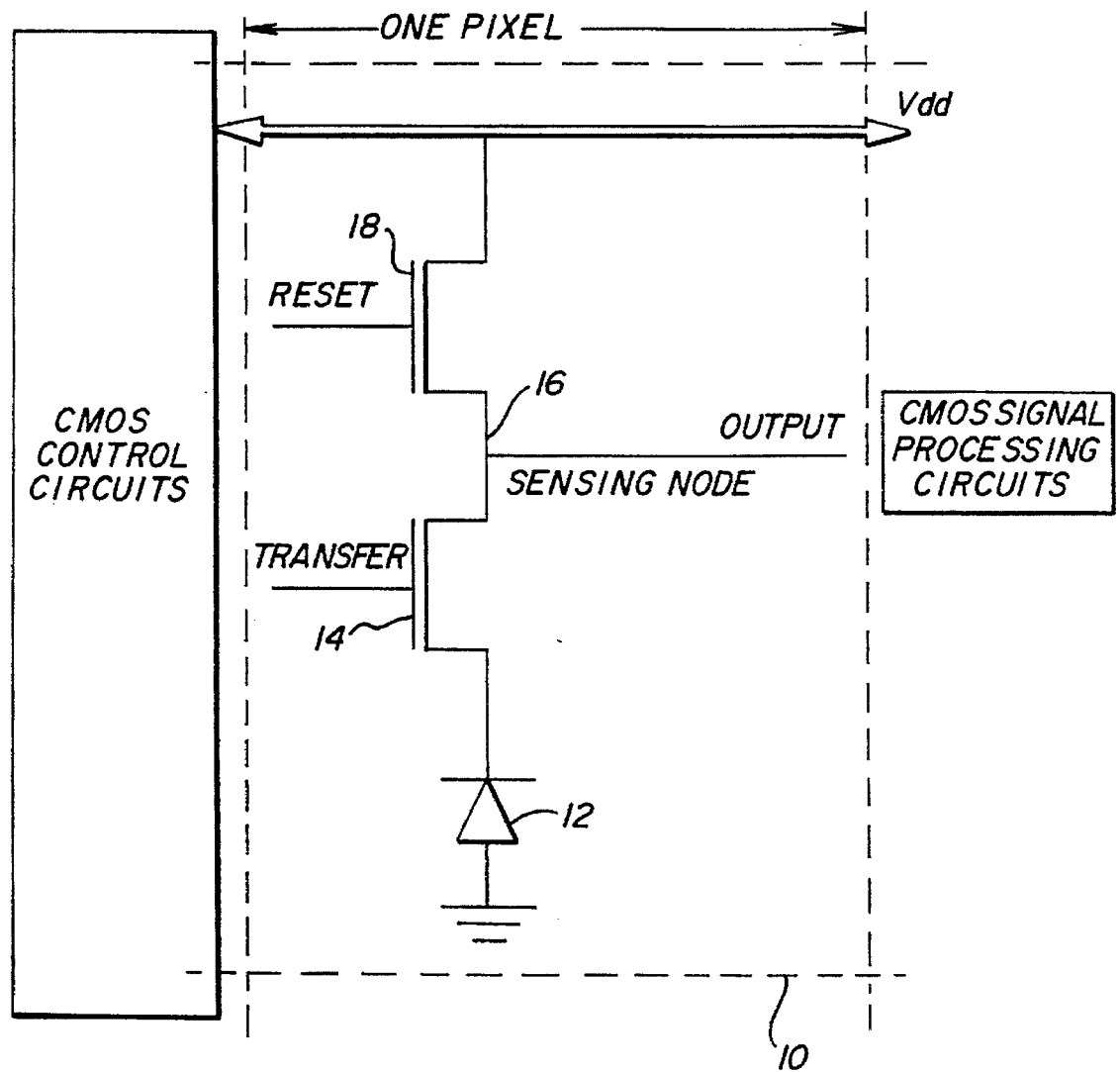
FIG. 1 is a schematic diagram of the pinned photodiode based active pixel sensor of the present invention.

FIG. 1 shows a schematic diagram of the pinned photodiode based active pixel sensor of the present invention, as employed within a CMOS based signal processing system. To improve the blue response, reduce lag and minimize the dark current characteristics of the active pixel sensor, a new CMOS imager has been integrated with a pinned photodiode 12 using a mixed process technology. This combines n-well CMOS technology and a pinned photodiode process to provide a sensor having the best features from both technologies. An n×m pinned photodiode active pixel sensor can be designed and fabricated, where n and m are number of pixels on the edges of the sensor. The present invention has advantages by incorporating image-sensor technology in CMOS active sensor.

Figure 2:
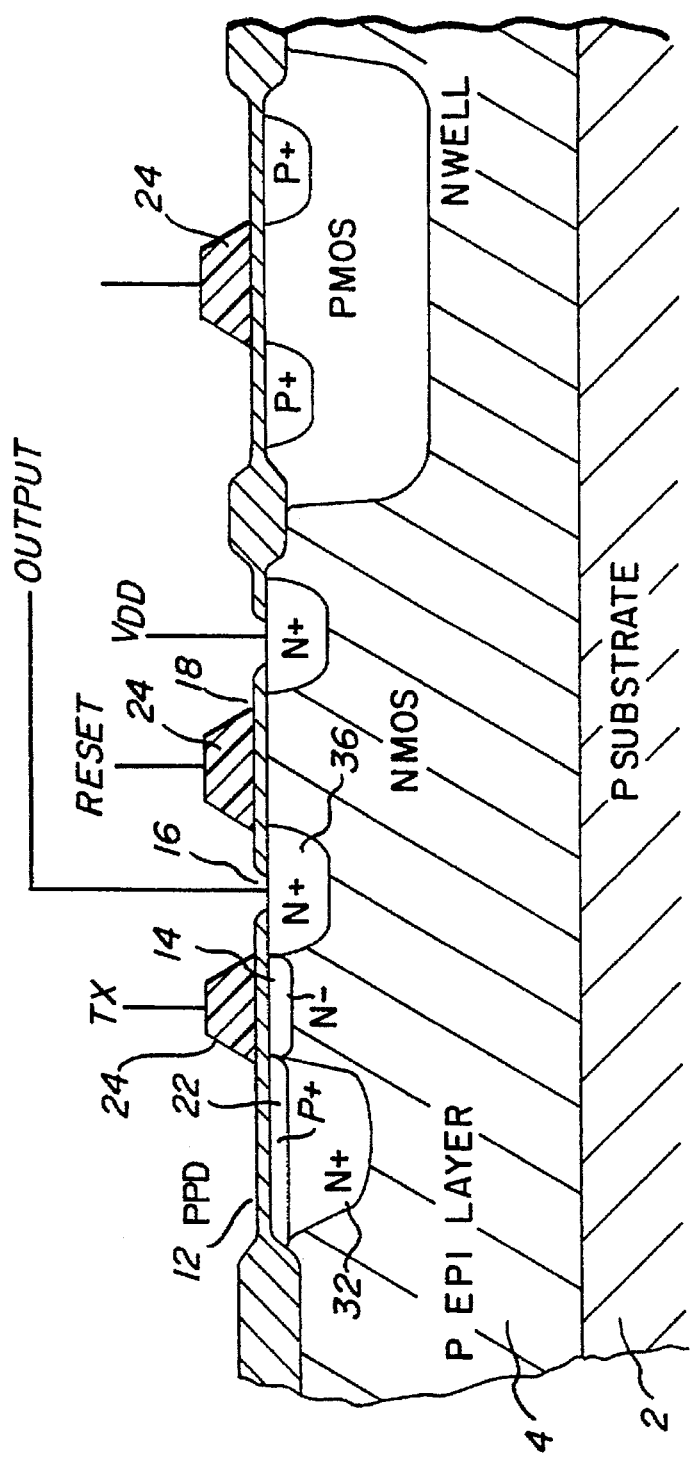
FIG. 2 is a cross sectional diagram of the devices used in creating the sensor of the present invention.

FIG. 2 illustrates a cross sectional diagram of the devices used in creating the sensor of the present invention. This is the result of integration of an active pixel sensor (APS) architecture typically fabricated in Complementary Metal Oxide Semiconductor (CMOS) technology with a pinned photodiode 12 (PPD) device using a mixed process technology. This new technology allows mixing of CMOS and high performance Charge-Coupled Device (CCD) modules. The PPD 12 becomes the photoactive element in an XY-addressable area array with each pixel containing active devices for the transfer 14, readout via floating diffusion 16, and reset 18 functions. An n-well CMOS technology was combined with the CCD process to provide the best features from both technologies. By replacing the polysilicon photocapacitor or photogate in conventional APS with the pinned photodiode 12, deficiencies in poor blue response, image lag and high dark current are minimized.

A buried-channel photocapacitor (not shown) biased in the accumulation mode would not have the limitations in dark current that CMOS technology has. A buried channel photcapacitor has essentially equivalent dark current characteristics to the PPD. The blue response problem can also be eliminated by using transparent gating material. An example of such a material would be Indium Tin Oxide (ITO). Therefore, employing both a buried channel photocapacitor with a transparent gate electrode provides for superior characteristics for blue light response and dark current, similar to those achieved by the PPD. Both the buried channel photocapacitor with a transparent gate and the PPD are devices typically associated with CCD technology. The present invention incorporates these devices from the CCD technology with CMOS processing capabilities. The construction of a active pixel sensor employing a buried channel photcapacitor would be similar to the PPD in FIG. 2 with the photocapitor structured much like the transfer gate of the PPD embodiment. The transfer gate of the photocapacitor embodiment then would be without the buried channel of the transfer gate used by the PPD embodiment.

The process integration mixes the two technologies resulting in performance which is comparable to that obtained by each of the conventional processes, individually. This was demonstrated on linear image sensors and CMOS test circuits.

In the mixed process technology, schematic representation of the process flow is given in FIG. 3a through 3g.

Figure 3A:
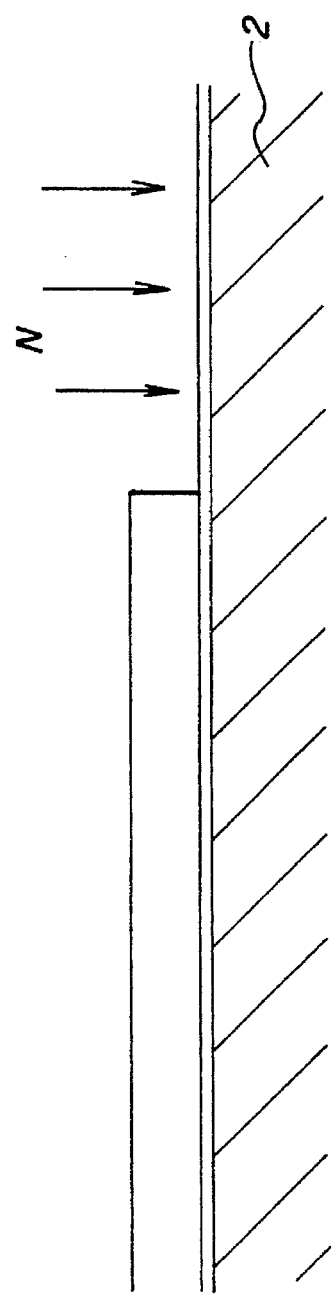

FIG. 3a illustrates the patterning and ion implantation used within the present invention to form n-well 40 which is used to contain the PMOS transistors that will form part of the control circuits of present invention.

FIG. 3b and 3c show the patterning and growth of isolation oxide/field oxide which is used for isolating devices to be formed on the silicon layer 2 with or without epitaxial layers and with or without wells structures.

FIG. 3d illustrates the patterning and ion implantation of an n-type buried channel 15 which is used to form the transfer gate 14 of the pixel within the present invention. After the implantation of the buried channel 15, photoresist layer 52 is removed and a polysilicon layer 26 is formed upon the substrate. The polysilicon 26 is used to form local interconnects and the gates of transistors. Both PMOS and NMOS transistors will have their gates formed by this polysilicon 26.

Figures 3E, 3F, 3G:
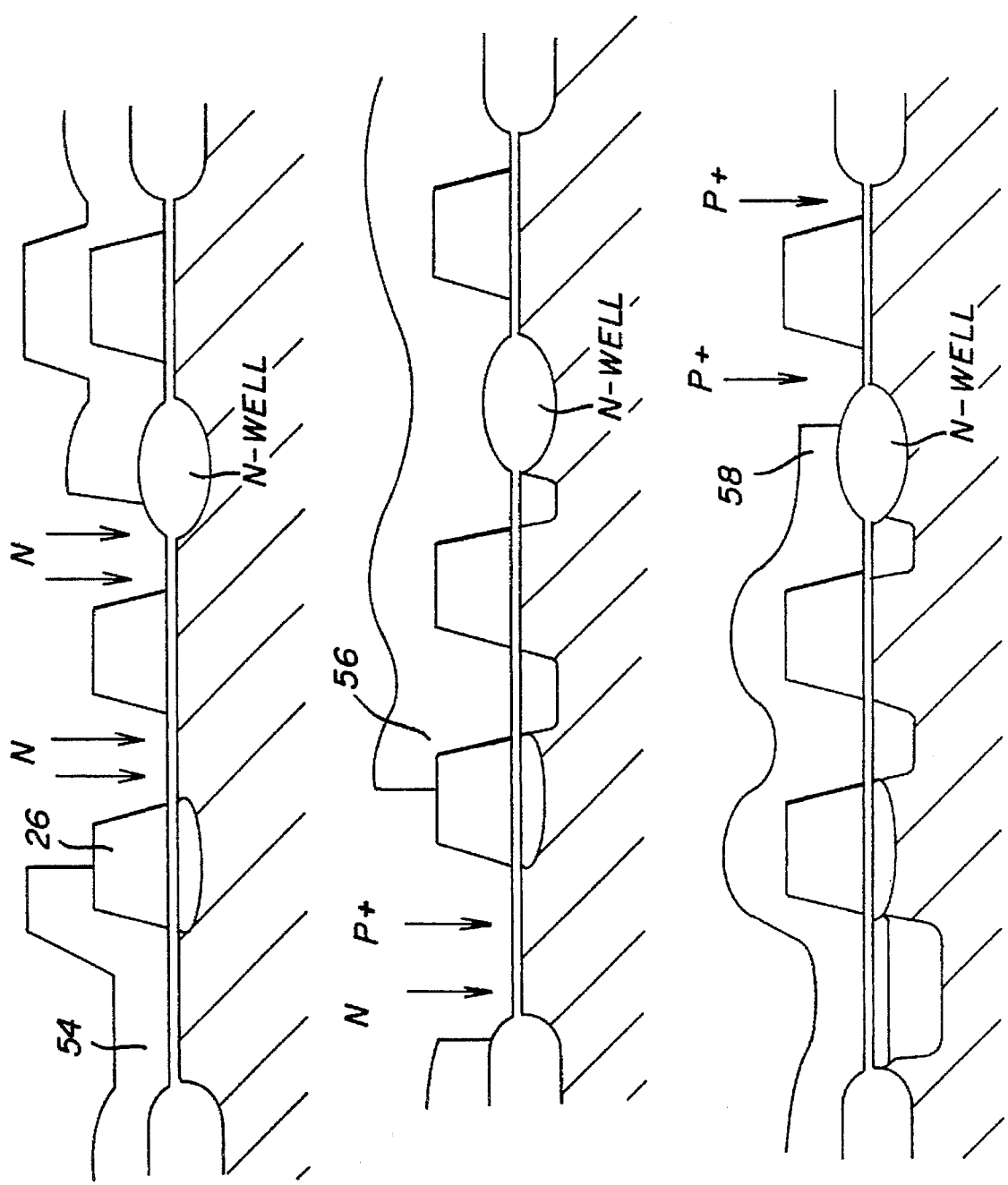

FIG. 3e shows the patterning of the polysilicon 26 with photoresist 54 and implantation of N+ dopant to form source and drain regions. This results in source and drain regions that are self aligned to the remaining polysilicon 26. This forms the NMOS transistors within the preferred embodiment.

FIG. 3f show the construction of the PPD by patterning with photoresist 56 areas for two additional implants. The first implant is to create a photodiode by implanting a deeper N+ impurity than was previously used by the source and drain implants discussed above. The deeper implant yields substantial increases in photo response due to an increase collection path for the incident photo carriers with the deeper implant. A pinning layer 22 implant is then made using high doses of low energy P+ dopant that remains near the surface of the photodiode 32.

FIG. 3g shows the patterning with photoresist 58 and the following ion implantation of the source/drains of the PMOS transistors. As with the NMOS transistors, the source/drain implants for the PMOS transistors are self aligned with the selected polysilicon. P+ implant are used to construct the PMOS transistors.

The device is completed by the appropriate planarization and metalization steps.

The imager architecture of the present invention can be employed to signal processing circuitry of prior art devices to increase their overall performance. An example is the incorporation of the present invention into an earlier designs implemented at Jet Propulsion Laboratory. This earlier design is described in IEEE Transactions on Electron Devices, Vol. 41, No. 3, March 1994 (hereinafter referred to as JPL). While describing a photogate integrated into an active pixel sensor, the device as taught by JPL did not provide a sensor that yielded satisfactory blue wavelength color response. Additionally, the JPL device lacked sufficient low dark current noise characteristics. The present invention overcomes these shortcomings by incorporating pinned photodiode technology not conventionally applied within CMOS technology. This results in an image sensor having superior response for blue light and improved dark current noise characteristics.

While the best mode known to the inventor has been disclosed by the preferred embodiment, various modfications will be obvious to those skilled in the art. These obvious modifications should be considered in view of the appended claims.

Parts List 2 substrate
4 epitaxial layer
10 pixel
12 photodiode
14 transfer
15 channel
16 diffusion
18 reset
22 pinning layer
26 polysilicon
32 photodiode
40 n-well
52 photoresist layer
54 photoresist
56 photoresist
58 photoresist

We claim:

1. An active pixel sensor having at least one pinned photodiode comprising:

a semiconductor material of a first conductivity type having a series of masking layers including at least one conductive layer, and at least one charge sensing means;

at least one transfer gate and a series of local interconnections upon the conductive layer;

a first set of implants made from a second conductivity type that is opposite the first conductivity type, the first set of implants functioning as sources and drains for a first set of transistors, including at least one source for each of the transfer gates such that the drain is self aligned to the transfer gate;

at least one image sensing area adjacent to the transfer gate formed from one of the sources implanted within the substrate to create a photodiode, with a pinning layer comprising a material of the first conductivity type on top of the photodiode;

a second set of implants used as sources and drains for a second set of transistors made from implants of the first conductivity type, the second set of transistors being formed in conjunction with any remaining the first set of transistors that were not used to create image sensors to form a CMOS control circuit coupled to the image sensor by the local connection; and a predetermined set of contacts on first and second set of source drains.

2. The invention of claim 1 further comprising a transfer region of the second conductivity type below the transfer gate such that it is essentially aligned with a side of the transfer gate adjacent to the photodiode.

3. The invention of claim 2 wherein the pinning layer further comprises that it has at least one edge that is self aligned to a side of the transfer region adjacent to the photodiode.

4. The invention of claim 1 further comprising the charge sensing means is a drain being self aligned to the transfer gate comprising a floating diffusion region that is coupled to the second set of transistors.

5. The invention of claim 1 wherein the image sensing area is an array of pinned photodiodes that is operatively controlled by the CMOS control circuit via the local interconnections.

6. A pinned photodiode integrated within an image sensing element comprising:

a substrate of semiconductor material made from a first conductivity type;

a plurality of regions of a second conductivity type that is opposite the first conductivity type formed within the substrate, such that there is at least one image sensing region and at least one image transferring region and at least one charge sensing well for each of a plurality of image sensing pixels;

a transfer region formed as a buried channel layer from the second conductivity type between the image sensing region and the image transferring region within each of the pixels;

a pinned photodiode formed upon the image sensing region from ions of the first conductivity type such that at least one edge of the pinned photodiode is self aligned to a side of the transfer gate adjacent to the photodiode;

a charge sensing node region formed within each of the pixels from one of the image transferring regions adjacent to the transfer region;

a transfer gate for controlling charge flow from the pinned photodiode to the charge sensing node region;

a plurality of regions of the first conductivity type formed within the substrate, functioning as sources and drain for a second set of transistors; and means for coupling the charge sensing node region to the second set of transistors.

7. An active pixel image sensor comprising:

a pinned photodiode operatively coupled to CMOS control circuitry.

8. The invention of claim 7 further comprising a plurality of pinned photodiodes operatively coupled to CMOS control circuitry.

9. The invention of claim 8 wherein each of the pinned photodiodes is separately addressable by the CMOS control circuitry.

10. The active pixel sensor of claim 7 wherein the pinned photodiode is operatively coupled to a CMOS control circuit through a buried channel transfer gate.

11. The active pixel sensor of claim 7 further comprising a reset gate operatively coupled to a charge sensing node and the pinned photodiode.

12. The active pixel sensor of claim 7 further comprising amplification means for applying charge from the pinned photodiode to the CMOS control circuitry in a predetermined manner.

13. The active pixel sensor of claim 7 further comprising a plurality of pinned photodiode elements formed into an array.

14. The active pixel sensor of claim 7 further comprising the pinned photodiode being operatively coupled to at least one NMOS control circuit.

15. The active pixel sensor of claim 7 further comprising the pinned photodiode being operatively coupled to at least one PMOS control circuit.

* * * * *